(12) United States Patent
Bischof et al.

(10) Patent No.: US 9,044,777 B2
(45) Date of Patent: Jun. 2, 2015

(54) BLADE COATING

(75) Inventors: Hubert Bischof, Mürzzuschlag (AT);
Antje Berendes, Bergatreute (DE);
Wolfgang Peter Mayr, Vienna (AT);
Alexander Etschmaier, Neuberg (AT);
Norbert Gamsjäger, Bad Fischau (AT)

(73) Assignee: Voith Patent GmbH, Heidenheim (DE)

( * ) Notice: Subject to any disclaimer, the term of this patent is extended or adjusted under 35 U.S.C. 154(b) by 370 days.

(21) Appl. No.: 13/428,087

(22) Filed: Mar. 23, 2012

(65) Prior Publication Data

US 2013/0174779 A1    Jul. 11, 2013

Related U.S. Application Data

(63) Continuation of application No. PCT/EP2010/061262, filed on Aug. 3, 2010.

(30) Foreign Application Priority Data

Sep. 23, 2009  (DE) .................. 10 2009 029 698

(51) Int. Cl.

| | |
|---|---|
| *B05C 11/04* | (2006.01) |
| *D21G 3/00* | (2006.01) |
| *B31F 1/14* | (2006.01) |
| *D21H 23/34* | (2006.01) |
| *D21H 25/08* | (2006.01) |
| *D21H 25/10* | (2006.01) |

(Continued)

(52) U.S. Cl.

CPC .............. *B05C 11/045* (2013.01); *C23C 14/025* (2013.01); *B31F 1/145* (2013.01); *B41F 9/1072* (2013.01); *D21G 3/005* (2013.01); *D21H 23/34* (2013.01); *D21H 25/08* (2013.01); *D21H 25/10* (2013.01)

(58) Field of Classification Search
CPC ...... B31F 1/145; C23C 14/025; D21G 3/005; B05C 11/045
USPC .................. 118/261, 414; 15/256.5; 162/281
See application file for complete search history.

(56) References Cited

U.S. PATENT DOCUMENTS 5,305,726 A * 4/1994 Scharman et al. ............ 123/668
5,308,422 A * 5/1994 Askay et al. ................ 156/89.28

(Continued)

FOREIGN PATENT DOCUMENTS

| FR | 2 748 759 A1 | 11/1997 |
|---|---|---|
| WO | 98/28089 A1 | 7/1998 |

(Continued)

OTHER PUBLICATIONS

International Search Report dated Jan. 14, 2011 for International Application No. PCT/EP2010/061262 (6 pages).

*Primary Examiner* — Dah-Wei D Yuan
*Assistant Examiner* — Binu Thomas
(74) *Attorney, Agent, or Firm* — Taylor IP, P.C.

(57) ABSTRACT

The invention relates to a doctor blade for the surface treatment of fibrous nonwoven webs, including a main body and a coating arranged on the surface of the main body, wherein the coating covers at least the part of the surface of the main body on which the doctor blade is provided for contact with the fibrous nonwoven web, and wherein the porosity of the coating is less on the first surface adjoining the main body than on the surface arranged opposite thereof.

7 Claims, 1 Drawing Sheet

(51) Int. Cl.
*C23C 14/02* (2006.01)
*B41F 9/10* (2006.01)

(56) References Cited

U.S. PATENT DOCUMENTS 5,727,468 A * 3/1998 Blackwell ................ 101/365
5,824,154 A * 10/1998 Freti ........................ 118/126
6,687,950 B1 * 2/2004 Rata et al. .............. 15/256.51
2003/0092549 A1 5/2003 Coddet et al.
2004/0137261 A1 * 7/2004 Lunnerfjord et al. ....... 428/679
2005/0051292 A1 * 3/2005 Laithier et al. .............. 162/281
2007/0284255 A1 * 12/2007 Gorokhovsky et al. ....... 205/89

FOREIGN PATENT DOCUMENTS

| WO | 00/00296 A1 | 1/2000 |
| WO | 2006/134209 A1 | 12/2006 |
| WO | 2007/003332 A1 | 1/2007 |

* cited by examiner

BLADE COATING

CROSS REFERENCE TO RELATED APPLICATIONS

This is a continuation of PCT application No. PCT/EP2010/061262, entitled "BLADE COATING", filed Aug. 3, 2010, which is incorporated herein by reference.

BACKGROUND OF THE INVENTION

1. Field of the Invention

The invention relates to a doctor blade for machines for paper production and relates in particular to the coating of doctor blades to improve the doctor blade surface.

2. Description of the Related Art

As a rule, the fibrous web, the so-called base-paper web, produced in the paper manufacturing process does not yet possess the surface properties required for specific paper qualities which are to be produced and must therefore be processed accordingly.

For smoothing of the web surface a pasty coating layer consisting of pigments, binding agents and additives is generally applied to said surface. Coating of the paper web can occur in a separate operation, but is however normally integrated into the paper manufacturing process through integration of a coater into the paper machine. Smooth paper surfaces are achieved with the blade coating method, whereby an excess of coating medium is initially applied onto the paper and is then doctored off with a doctor blade. Due to the pressure exerted on the coating medium by the doctor blade which is referred to as a coating blade the indentations on the paper surface are filled with coating medium, thereby achieving a uniform surface on the coated paper.

Surface structures, for example on hygienic papers, are produced according to the creping process, whereby the web is directed over a doctor, which is referred to as creping doctor blade.

Based on the high pressure with which the doctor blade rests on the paper web, whereby as a rule the contact pressure is 150 N/m (contact pressure relative to the length of the doctor blade) or higher, high demands are put upon the wear resistance of the doctor blade. Doctor blades used in surface treatment of the paper web are therefore often manufactured from high-tensile steel.

It is known to provide the surface of doctor blades in the regions in which the blade rests on or respectively makes contact with the coating medium with a coating which has a higher wear resistance than the base material of the doctor blade. Such coatings are generally produced from an abrasion-resistant material by using metal oxides or hard metals into which a metal-carbide is embedded into a cobalt-, nickel- or iron matrix. In order to apply coatings which are physically as well as chemically as homogeneous as possible, thermal spray techniques are preferably used, whereby the coating material is applied in several passes. Each of the passes provides a thin layer of coating material onto the doctor blade, or respectively onto the already previously applied coating layers. Application of the coating in several thin layers ensures that the components of the coating material cannot separate during buildup of the coating. Based on the chemical as well as physical identity of the individual layers a homogenous coating is hereby produced.

In order to prevent developing of doctoring streaks in the coating on the paper web or respectively on the creped paper web the surface of the doctor blade coating is ground smooth after application to an extent that it exhibits roughness values which are as low as possible. With certain combinations of coating material and for materials used in the design of the doctor blade base body it may be necessary to arrange an additional coat between the coating and doctor blade base body which offers better adhesion of the coating on the doctor blade base body.

A further development of an abrasion-resistant doctor blade coating provided with an adhesion layer is introduced in the international patent application WO 2006/134209 A1. The coating features a multi-layer design in which the surface of the coating intended to make contact with the paper web is formed by a hard material, for example tungsten carbide, chromium carbide or titanium carbide, whereas the side of the coating abutting the doctor blade base body is formed by a material with good adhesion properties on the doctor base body. Materials suitable for this layer are titanium oxide and aluminum oxide. The layers arranged between these two outer layers feature a mixture of both layer materials, whereby the portion of one layer material decreases with increasing distance from the coating surface built up from this material.

In the doctoring process the doctor blade exhibits higher wear at the edges of the paper web, than in between, since the outer ends of a doctor blade are generally not in contact with a coating medium and are therefore abraded sooner by the rough surface of the fibrous mat forming the raw paper web than the part of the blade which comes into contact with the coating medium. In order to counter this effect it is suggested in the international patent application WO 98/28089 to provide the doctor blade with an additional layer which is arranged between the doctor blade base body and the actual coating. This intermediate hard material layer possesses a lower wear rate than the useful work coating and can therefore maintain the blade profile over a longer period of time.

If the doctor blade is worn it must be replaced. After replacement it takes however some time until the new blade is "run in" which indicates the fact that, even though the doctor blade coating was ground to precisely match the geometry of the paper web orientation, smaller deviations still exist in practice in both geometries. The doctor blade consequently does not produce the demanded quality of paper web surface. The time to "run in" the doctor blade is the time which is required until the paper surface exhibits the demanded quality and can be as long as an hour.

The paper produced during the "run in" time is of inferior quality and has to be disposed of under certain circumstances.

It is therefore desirable to cite, and what is needed in the art is, a doctor blade for surface treatment of fibrous webs, for example paper webs, which makes shorter run-in times possible.

SUMMARY OF THE INVENTION

In accordance with one design form, the present invention provides that the doctor blade has a base body and a coating arranged on the surface of the base body, wherein the coating covers at least the region of the surface of the base body on which the doctor blade is provided for contact with the fibrous web, and wherein the coating has a porosity which is greater on the surface of the coating facing away from the base body than on the surface of the coating adjoining the base body.

In this context it is pointed out that terms used in this description and in the claims in listing of characteristics, such as "comprise", "feature/exhibit", "include", "contain" and "with" as well as grammatical variations thereof, are generally not to be viewed as a conclusive listing of characteristics such as process steps, devices, regions, sizes and the like and are in no way to exclude the presence of other or additional characteristics of groupings of other or additional characteristics.

A doctor blade with a coating whose surface region is porous has a lower abrasion resistance compared to a doctor blade with a substantially non-porous surface region, and adjusts therefore more quickly to a geometry of a paper web being moved over the doctor blade deviating from the doctor blade geometry. Substantially non-porous in this context means that the porosity is consistent with the technically possible minimum.

An additional design form of the doctor blade features a coating whose porosity increases from the first surface adjoining the base body toward the surface arranged opposite thereof. In such progression of porosity over the thickness of the coating the abrasion resistance of the blade coating increases with increasing removal, wherein the wear rate is reduced after the running-in process and the run in blade profile which is also referred to as "run-in profile" results.

According to an additional design form the coating of the doctor bade has a first and a second coat, whereby the first coat adjoins the base body and is substantially non-porous and whereas the second coat arranged on the first coat has a predetermined porosity. The porous part of the coating can hereby be limited to the thickness which is required to build up and maintain the run-in profile.

In an additional design form the coating of the doctor blade may comprise one or several additional coats which are arranged on the side of the second coat facing away from the base body. The porosity of an additional coat is hereby greater than the porosity of each coat arranged between this additional coat and the first coat of the coating. An accordingly built up coating offers great freedom in the configuration of porosity progressions and thereby the possibility to adjust a porosity progression to the respective particularities of various run-in processes.

According to an additional design form the first coat of the coating comprises several layers, whereby a chemically and physically homogeneous composition of the first coat is achieved. In another design variation the second or at least one of the additional coats can each be built up of several layers, enabling a certain porosity as well as material composition to be maintained over a certain coat thickness.

In order to ensure a long operating life of the coating after running it in, an additional design form provides that the thickness of the first coat is at least half the thickness of the coating.

According to additional design forms of the doctor blade, the material composition of the second coat and/or that of an additional coat of the coating differ from that of the first coat of the coating. This allows for the abrasion resistance of the individual coats to be additionally varied, in order to achieve an as rapid as possible adaptation of the blade profile to the paper web profile, thereby shortening the run-in phase on the one hand, and on the other hand to maintain the blade profile which was obtained in the run-in phase over the entire lifespan of the blade. For example, the first coat may be formed from a first material, whereas the second and/or one or more of the additional coats are formed from a second material or from a mixture of first and second materials.

According to an additional design form the first material contains metal-like carbide, whereby a layer/coat having great hardness is achieved. In an additional design form the second material may contain a metal-oxide, whereby also a sufficiently high hardness is achieved which however is preferably lower than the hardness of a coat produced with the first material.

Additional characteristics of the invention result from the following description of design examples, together with the claims and the drawings. The individual characteristics can be realized according to the invention in one design form alone, or in several.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 1:
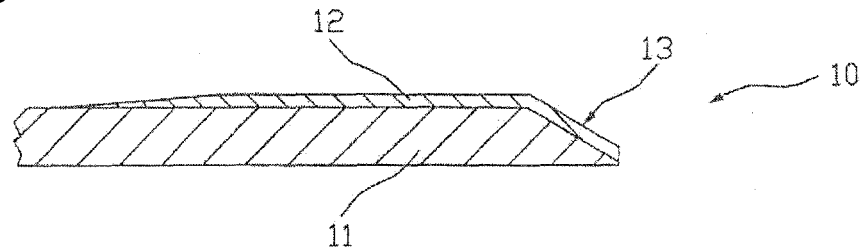
FIG. 1 is a schematic cross section through a coated doctor blade.

The schematic view of FIG. 1 shows a cross section through the front region of a doctor blade 10 provided with a coating 12. Coating 12 occupies at least that region of doctor blade 10 which comes into contact with the fibrous web or respectively with the coating material applied thereto. Doctor blade 10 features a base body 11, as well as a coating 12. Doctor blade 10 also features a bevel 13, which is generally known as blade edge. As a rule, coating 12 covers base body 11 as illustrated, also in the region of blade edge 13.

Figure 2:
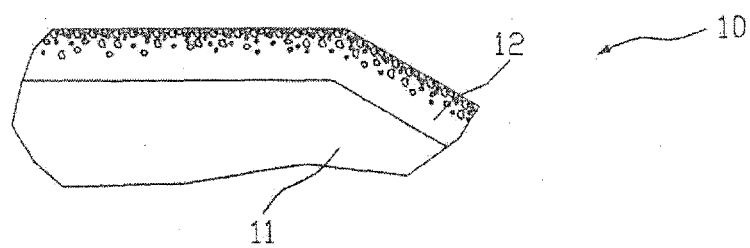
FIG. 2 shows the region of the doctor blade from FIG. 1, near the blade edge depicted in an enlarged illustration.

The schematic cross sectional illustration in FIG. 2 shows a detailed section of doctor blade 10 from FIG. 1 at the transition to blade edge 13. As can be seen from the illustration, coating 12 has hollow spaces, the concentration of which increases toward the free surface of the coating, namely in the direction of the side of coating 12 facing away from base body 11. In other words, the porosity of coating 12 is greater on its top surface than on its underside which adjoins the base body. Porosity is hereby understood to be the relationship of hollow space volume relative to overall volume of one volume unit of the coating.

The portion of a porous surface taken up by the coating material is smaller than its entire surface. Accordingly in the case of a porous surface, less coating material is in contact with the fibrous material or the coating medium of the paper web than in the case of a non-porous surface. At the same contact pressure, the wear rate of the porous surface is therefore higher. The wear rate is higher, consistent with higher porosity of the surface.

In order to shorten the time required to run in the blade, the surface of coating 12 is therefore designed to be porous, whereby the pores extend preferably at least to a depth which is ground during the run-in time. In one design form, coating 12 features two coats, whereby the first coat adjoining base body 11 has no pores or respectively the fewest possible pores which can be achieved in a process used to produce the coat. A coating formed in this manner ensures that after the run-in period an abrasion resistant coating is present which ensures a long lifespan of the doctor blade. On this first coat a second coat is arranged whose thickness is at least consistent with the blade profile change expected during the run-in process. The thickness of this second coat has a value in particular which is consistent at least with the difference between the maximum removal and the minimum removal of the coat during the run-in process.

In an additional design form more than one additional coat is arranged on the first coat, whereby the porosity of each of these additional coats increases with increasing distance from the first coat, so that the greatest porosity is to be found on the surface of coating 12 facing away from base body 11. The porosity can alternatively also be maintained constant within several adjacent coats, whereby the porosities of coats near the open surface of the coating, namely close to their top side is greater than that of the coats arranged closer to the underside of the coating.

Coating 12 is applied to base body 11 preferably by means of thermal spraying over several passes, for example between 10 and 100 passes. Each pass produces a thin layer of the coating material, whereby the first layer is sprayed directly onto the surface of the base body and additional layers onto the respective previously applied layer. The physical homogeneity or respectively vice versa the porosity of the individual layers can be adjusted through the parameters of the utilized method. For example in the spray method known by its acronym HVOF (High Velocity Oxygen Fuel) the porosity can be adjusted through the relationship of fuel/oxygen and through the feed rate of the powder material which is necessary for the coat formation. By changing the parameters from layer to layer, the porosity can be increased up to the top surface of the coating.

An increased wear rate of the coating is desirable only during the run-in phase which, as a rule only represents a very small fraction of the entire useful life of the doctor blade. At the end of the run-in process the surface of coating 12 features a profile which is adjusted optimally to the geometry of the fibrous web of the paper in the doctor blade contact region. If the porosity of the coating over its depth changes too abruptly, then the run-in profile can in some cases be temporarily abraded. The porosity thereby changes preferably constantly, that is not in increments between the two maximum values, namely between the porosity on the original top surface of the coating and the porosity on the underside.

Figure 3:
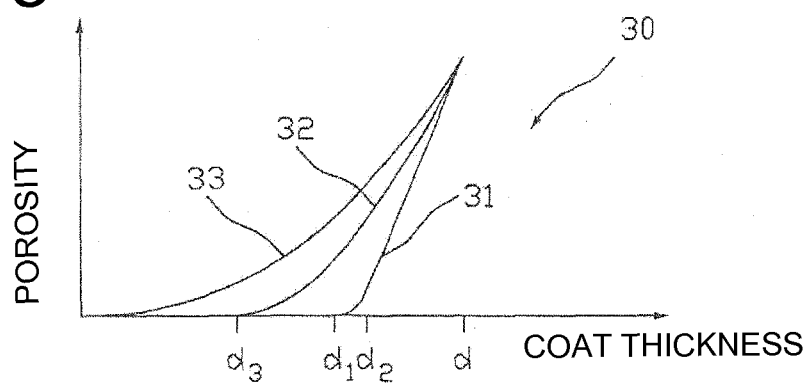
FIG. 3 is a diagram with different porosity progressions over the thickness of the coating.

Diagram 30 in FIG. 3 illustrates three examples for porosity progressions within coating 12. In porosity progression 31 the porosity of the coating material on the underside of coating 12 equals zero or respectively the minimum and increases non-linearly from a coat thickness $d_1$ to a coat thickness $d_2$, and linearly from coat thickness $d_2$ to the top surface d of coating 12. An according porosity progression 31 is particularly suited for instances where maximum removal of coating during the run-in phase is low.

If deeper profiles are ground into the top surface of the coating during the run-in phase, then the porosity of coating 12 preferably extends over a more extensive region of the coating surface, for example according to a porosity progression as depicted by curve 32 in diagram 30 of FIG. 3. In this progression the porosity starting from the underside of the coating material to a thickness $d_3$ which is less than the previously described thickness $d_1$ is minimal or respectively zero and increases then non-linearly until the top surface d of the coating. In deviating from this, curve 32 can obviously also transition to a linear progression in the region close to the coating surface. In certain cases, for example when using very hard materials, the porosity can also continue until or close to the underside of coating 12 at the interface with base body 11, as depicted by curve 33 in FIG. 3.

Based on the described variation of the material porosity over the thickness of coating 12 the wear rate of the coating surface can be adjusted depending on its remaining thickness. A variation of material composition of the coat over its depth is not necessary for this. For the production of such coatings a commercially available hard metal powder with approximately 8-10% cobalt and tungsten-carbide is preferably used as the hard material.

According to an additional design form the material composition also varies in addition to the porosity over the thickness of the coating. Due to this it is possible to further increase the wear rate on the original surface of coating 12 and to additionally shorten the run-in phase while the lower layers of the coating can be optimized relative to an as long a lifespan of the doctor blade as possible. For example, the region of the coating near to its top surface may feature materials having a lesser hardness than the materials which are located in the region of the underside of the coating.

For example, the region near the top surface of coating 12 may comprise a high portion of metal-oxides or -nitrides, for example aluminum-oxide or titanium-nitride, whereas the coats near base body 11 feature a high content of metal-like carbides, for example tungsten-carbide, boron-carbide, chromium-carbide, titanium-carbide or the like.

Figure 4:
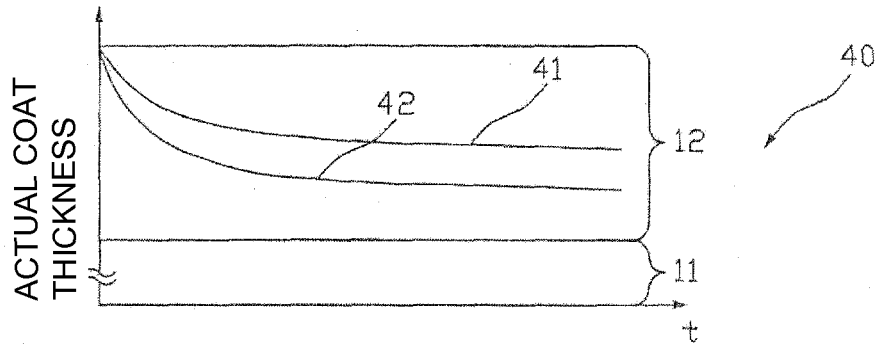
FIG. 4 is a diagram to illustrate the wear characteristics of the doctor blade.

In diagram 40 of FIG. 4 the wear properties 41 of a non-porous or respectively slightly porous coating is compared to the wear properties 42 of a previously described porous coating. Curve 41 and 42 only illustrate the respective wear processes qualitatively and do not illustrate metrologically or theoretically acquired wear curves. For better understanding coating 12 and base body 11 are assigned to the two curves.

The porous top surface of coating 12 is removed more quickly than a low-porosity or respectively non-porous coating surface. Accordingly, curve 42 descends steeper at the beginning than curve 41. With decreasing porosity in the lower layers of coating 12 their wear rate decreases and, at the transition to the non-porous deeper layers, approaches that of a non-porous coating.

The invention enables an initial high wear of the surface of a doctor blade which is in contact with the paper surface or respectively with its coating, so that the doctor blade can be ground in a short period of time to the geometry of the paper web moved along it. Due to the decrease of the porosity of the coating toward its underside, the wear rate of the coating also decreases. Based on this, the surface profile obtained during the run-in process is maintained and transferred true in its shape to the slightly porous or non-porous region of the coating, which is produced for an as low as possible wear rate and thereby high life span of the doctor blade.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A doctor blade for a surface treatment of a web of fibrous material, said doctor blade comprising:
   a base body including a surface; and
   a coating arranged on said surface of said base body, said surface of said base body including a region on which the doctor blade is provided for contacting the web, said coating covering at least said region of said surface of said base body, said coating including a first surface and a second surface, said coating having a porosity which is less on said first surface adjoining said base body than on said second surface arranged opposite thereof, said porosity of said coating increasing from said first surface adjoining said base body toward said second surface arranged opposite thereof, said coating including a first coat and a second coat, said first coat adjoining said base body and being substantially non-porous, said second coat being arranged on said first coat and having a porosity which is predetermined, said second coat including a side facing away from said base body, said coating including at least one additional coat which is arranged on said side of said second coat facing away from said base body, said at least one additional coat having a porosity which is greater than a porosity of any coat of said coating arranged between said at least one additional coat and said first coat, said at least one additional coat having a lower wear resistance than said second coat and said second coat having a lower wear resistance than said first coat.

2. The doctor blade according to claim 1, wherein said first coat includes a plurality of layers.

3. The doctor blade according to claim 1, wherein a thickness of said first coat amounts to at least half of a thickness of said coating.

4. The doctor blade according to claim 1, wherein a material composition of one of said second coat and said at least one additional coat differs from a material composition of said first coat.

5. The doctor blade according to claim 4, wherein said first coat is formed from a first material, at least one of said second coat and said at least one additional coat being formed from one of a second material and a mixture of said first material and said second material.

6. The doctor blade according to claim 4, wherein said first coat includes a metal carbide.

7. The doctor blade according to claim 6, wherein said second material includes a metal oxide.

* * * * *